United States Patent
Faralli et al.

(10) Patent No.: US 9,233,834 B2
(45) Date of Patent: Jan. 12, 2016

(54) MEMS DEVICE HAVING A SUSPENDED DIAPHRAGM AND MANUFACTURING PROCESS THEREOF

(71) Applicant: STMicroelectronics S.r.l., Agrate Brianza (IT)

(72) Inventors: Dino Faralli, Milan (IT); Paolo Ferrari, Gallarate (IT); Laura Maria Castoldi, Abbiategrasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/316,504

(22) Filed: Jun. 26, 2014

(65) Prior Publication Data
US 2015/0001651 A1    Jan. 1, 2015

(30) Foreign Application Priority Data

Jun. 28, 2013  (IT) ............................... TO2013A0540

(51) Int. Cl.
| | | |
|---|---|---|
| *B81B 3/00* | (2006.01) | |
| *B81B 7/00* | (2006.01) | |
| *B81C 1/00* | (2006.01) | |
| *B81C 3/00* | (2006.01) | |

(52) U.S. Cl.
CPC ............. *B81B 3/0021* (2013.01); *B81B 7/0016* (2013.01); *B81B 7/0058* (2013.01); *B81C 1/00158* (2013.01); *B81C 3/00* (2013.01); *B81B 2201/0264* (2013.01); *B81B 2203/0127* (2013.01); *B81B 2207/115* (2013.01); *B81C 2203/0118* (2013.01)

(58) Field of Classification Search
CPC ...................................................... B81B 3/0021
USPC .......................................................... 257/417
See application file for complete search history.

(56) References Cited

U.S. PATENT DOCUMENTS

| | | |
|---|---|---|
| 8,049,287 B2 | 11/2011 | Combi et al. |
| 8,089,828 B2 | 1/2012 | Fischer et al. |
| 2007/0286438 A1 | 12/2007 | Hirade et al. |
| 2009/0085191 A1 | 4/2009 | Najafi et al. |
| 2009/0260226 A1 | 10/2009 | Tinguely et al. |

(Continued)

FOREIGN PATENT DOCUMENTS

| | | |
|---|---|---|
| DE | 10 2008 001 185 A1 | 10/2009 |
| EP | 1 577 656 A1 | 9/2005 |

(Continued)

OTHER PUBLICATIONS

Je et al., "The novel sensitivity improved surface micromachined MEMS microphone with the center-hole membrane," *Procedia Engineering 25*:583-586, 2011.

*Primary Examiner* — Edward Wojciechowicz
(74) *Attorney, Agent, or Firm* — Seed IP Law Group PLLC

(57) ABSTRACT

A MEMS device wherein a die of semiconductor material has a first face and a second face. A diaphragm is formed in or on the die and faces the first surface. A cap is fixed to the first face of the die and has a hole forming a fluidic path connecting the diaphragm with the outside world. A closing region, for example a support, a second cap, or another die, is fixed to the second face of the die. The closing region forms, together with the die and the cap, a stop structure configured to limit movements of the suspended region in a direction perpendicular to the first face.

21 Claims, 6 Drawing Sheets

(56) References Cited

U.S. PATENT DOCUMENTS

| | | |
|---|---|---|
| 2010/0002543 A1 | 1/2010 | Schlosser et al. |
| 2010/0038733 A1 | 2/2010 | Minervini |
| 2010/0061073 A1 | 3/2010 | Oldsen et al. |
| 2010/0135123 A1 | 6/2010 | Fischer et al. |
| 2010/0158279 A1 | 6/2010 | Conti et al. |
| 2010/0164025 A1 | 7/2010 | Yang |
| 2010/0251818 A1* | 10/2010 | Ge et al. .................. 73/504.12 |
| 2010/0284553 A1 | 11/2010 | Conti et al. |
| 2011/0123053 A1 | 5/2011 | Wang et al. |
| 2012/0082325 A1 | 4/2012 | Sakurauchi et al. |
| 2012/0139066 A1 | 6/2012 | Je et al. |
| 2013/0098155 A1 | 4/2013 | Ohta et al. |
| 2013/0283912 A1* | 10/2013 | Lin ........................... 73/514.16 |
| 2014/0286509 A1 | 9/2014 | Sciutti et al. |
| 2014/0299948 A1 | 10/2014 | Wang et al. |

FOREIGN PATENT DOCUMENTS

| | | |
|---|---|---|
| EP | 2 214 421 A1 | 8/2010 |
| EP | 2 252 077 A1 | 11/2010 |
| WO | 2011/114398 A1 | 9/2011 |

* cited by examiner

MEMS DEVICE HAVING A SUSPENDED DIAPHRAGM AND MANUFACTURING PROCESS THEREOF

BACKGROUND

1. Technical Field

The present disclosure relates to a MEMS device having a suspended diaphragm and to the manufacturing process thereof. In particular, the following description makes reference, without this implying any loss in generality, to a MEMS pressure sensor of a packaged type.

2. Description of the Related Art

Sensors including micromechanical structures manufactured, at least in part, using semiconductor materials and MEMS (micro-electro-mechanical systems) technology are increasingly used, due to the advantageous characteristics of small dimensions, low manufacturing costs, and flexibility.

Specifically, pressure sensors manufactured using the MEMS technology typically find use in the medical field, in household apparatuses, in consumer electronics (cellphones, personal digital assistants—PDAs), and in the automotive field. In particular, in the latter sector, pressure sensors are traditionally used for detecting the pressure of vehicle tires, and are used by the control unit for signaling alarms. Pressure sensors are also used for monitoring the pressure of air-bags, for controlling the failure pressure of the ABS, and for monitoring the engine-oil pressure, the fuel-injection pressure, etc.

A MEMS sensor generally comprises a micromechanical detection structure, which transduces a mechanical quantity to be detected (for example, a set of acoustic waves, a pressure, etc.) into an electrical quantity (for example, correlated to a capacitive variation); and an electronic reading circuit, usually made as an ASIC (Application-Specific Integrated Circuit), which performs processing operations (including amplification and filtering) of the electrical quantity and supplies an electrical output signal of an analogue type—for example, a voltage—or a digital type—for example, a PDM (Pulse Density Modulation) signal. The electrical signal, possibly further processed by an electronic interface circuit, is then made available to an external electronic system, for example a microprocessor control circuit of the electronic apparatus incorporating the sensor.

To detect the mechanical quantity, MEMS sensors of the considered type comprise a diaphragm formed in or on a semiconductor die and suspended over a cavity. The diaphragm faces the external environment or is in communication with the latter through a fluidic path, as shown, for instance, in U.S. Pat. No. 8,049,287, filed in the name of the present applicant, disclosing a detection structure including a MEMS pressure sensor, of a differential capacitive type. In particular, in U.S. Pat. No. 8,049,287, the diaphragm faces a chamber formed in a protective cap fixed at the top to the die and perforated for exposure to the surrounding environment or faces a cavity etched from the back of the die and connected with the outside by a hole which extends through supporting elements.

Known MEMS sensors, albeit widely used and satisfactory, may be improved in particular as regards insensitivity to packaging stress and at the same time robustness of the sensitive part.

BRIEF SUMMARY

According to one or more embodiments of the present disclosure, there is provided a MEMS device and the manufacturing process thereof.

In one embodiment, the sensitive part of the device is separated from the rest of the die and supported via springs that uncouple the sensitive part from the rest of the die and absorb the packaging stress, without transferring it to the sensitive part. Furthermore, the sensitive part is housed within a cavity so as to be free to move. For a pressure sensor, moreover, the die is structured so that the sensitive diaphragm faces the external environment or is in communication with the latter via a fluidic path. Furthermore, the movement of the sensitive part is limited by a stop structure in such a way that the stress transferred to the springs cannot reach excessive values close to the failure value of the springs, for example during transport and assembly.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 1:
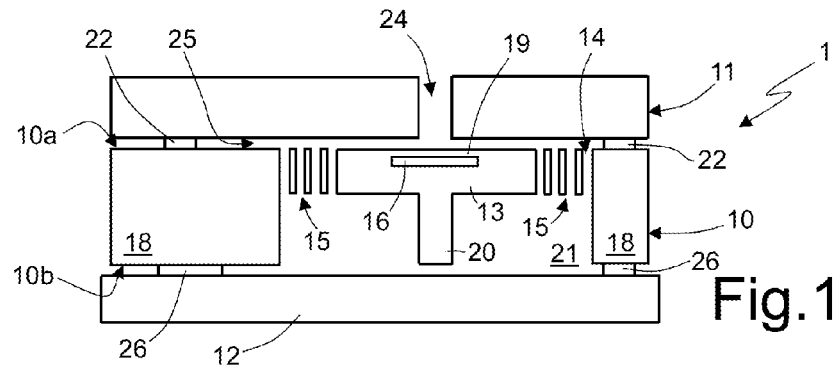
FIG. 1 shows a simplified cross-section of a MEMS sensor included in the present device.

FIG. 1 shows in a simplified way a MEMS sensor 1, a packaged pressure sensor, formed in a die or chip 10 of semiconductor material, such as silicon. In detail, the die 10 has a first face 10a and a second face 10b. A cap 11 is fixed to the first face 10a and closes the die at the top, and a closing body or region 12 is fixed to the second face 10b of the die 10 via spacers 26.

Figure 2:
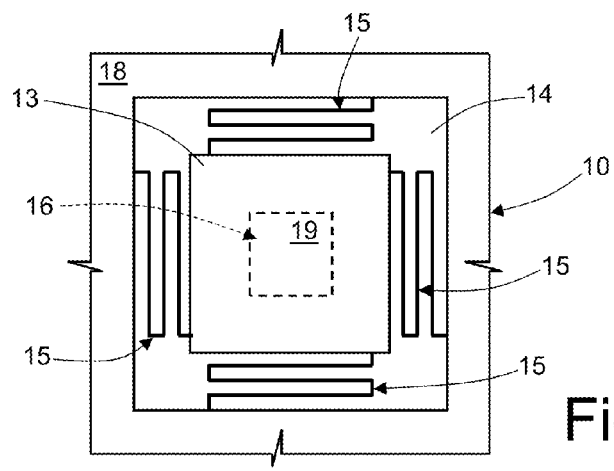
FIG. 2 is a top plan view on a detail of the MEMS sensor of FIG. 1.

As may be seen also from FIG. 2, the die 10 comprises a suspended region 13 separated from the rest of the die 10 (referred to hereinafter as peripheral portion 18) through a trench 14. Elastic elements (also referred to as springs 15) support the suspended region 13 and connect it mechanically to the peripheral portion 18. The suspended region 13 houses a buried cavity 16 delimiting at the bottom a portion of the suspended region 13 facing the first face 10a and forming a diaphragm 19.

In the example shown, the suspended region 13 and the trench 14 have a rectangular shape, in particular square, but other shapes, for example circular, may be envisaged.

In the embodiment of FIG. 1, the suspended region 13 and the springs 15 have a smaller thickness (in a direction perpendicular to the faces 10a, 10b) than the peripheral portion 18 of the die 10 so that an air gap 21 extends underneath the suspended region 13, delimited laterally by the peripheral portion 18 of the die 10.

The suspended region 13 is provided with a stop structure (also referred to as z-stopper), which limits oscillation of the suspended region 13 in the case of impact or stresses that might damage the springs 15. In the example of FIG. 1, the stop structure is formed by a stem 20 extending monolithically from the suspended region 13 into the air gap 21 towards the closing region 12, terminating at a short distance from the latter, distance that is equal to the thickness of the spacers 26.

The cap 11 covers at the top the entire first face 10a of the die 10 and protects the latter from an environment external the MEMS sensor 1. The cap 11 is fixed through bonding regions 22, for instance, of metal such as gold, tin, or copper, or of polymeric material or a glass-frit-based material, fixed to the peripheral portion 18 and is spaced apart from the first face 10a by a space 25 due to the thickness of the bonding regions 22. Furthermore, the cap 11 has a through hole 24 overlying the diaphragm 19 and fluidically connecting the diaphragm 19 to the environment surrounding the die 10. However, the position of the through hole 24 is not crucial, and the fluidic path may comprise even lateral holes or openings, provided that they are such as to connect the space 25 with the external environment.

The closing region 12 has a protective function during handling of the MEMS sensor 1 (for example, during transport to an assembly plant). In general, the closing region 12 is formed by a second die or chip housing components, whether electronic or not, for example an ASIC, but may be formed by another support, such as a printed-circuit board or the like. The spacers 26 may be formed by a layer of the FOW (Film-On-Wire) type or by a DAF (Die-Attach Film) or by some other material used in back-end manufacturing steps, or, if deposited in the front-end step, by materials with a base of gold, copper, tin, glass frit, or polymers.

In the MEMS device 1 of FIG. 1, the diaphragm 19 is fluidically connected to the external environment by the through hole 24 in the cap 11 and is sensitive to the external pressure of the MEMS device 100.

In fact, the diaphragm 19 is provided, in a per se known manner and not shown, with transducer elements, for instance, piezoresistive elements, which, upon detection of a deformation of the diaphragm 19 as a result of the pressure acting thereon, generate an electrical signal supplied to electronic components (not shown) integrated in the peripheral portion 18 and/or to an external processing circuit generating an electrical signal indicating the detected pressure.

Due to the described structure, the suspended region 13 carrying the sensitive part of the MEMS sensor (diaphragm 19) is free to move within certain limits in a vertical direction (perpendicular to the plane of main extension of the die 10 and thus to the faces 10a, 10b thereof) and is not affected by manufacturing stresses, in particular during packaging, in so far as the suspended region 13 is mechanically uncoupled from the peripheral portion.

On the other hand, the presence of a stop structure (in FIG. 1, the stem 20 together with the cap 11 and the closing region 12) prevents the springs 15 from being subjected to high stresses that might cause failure thereof. In fact, any possible impact or stress in a vertical direction cannot cause any overelongation of the springs 15, since the vertical displacement of the suspended region 13 is limited on one side by the cap 11 (the distance whereof from the suspended region 13 is fixed by the bonding regions 22) and on the other side by the distance between the stem 20 and the closing region 12, determined, as said, by the thickness of the spacers 26 (which can also be controlled in the design stage).

Consequently, the MEMS sensor 1 is resistant to any mechanical impact due to the transport and assembly or undergone during use of the device in the final application. In this way, the assembly mechanical yield of is enhanced and the reliability of the sensor are increased after assembly thereof in the devices that use it.

Figure 3:
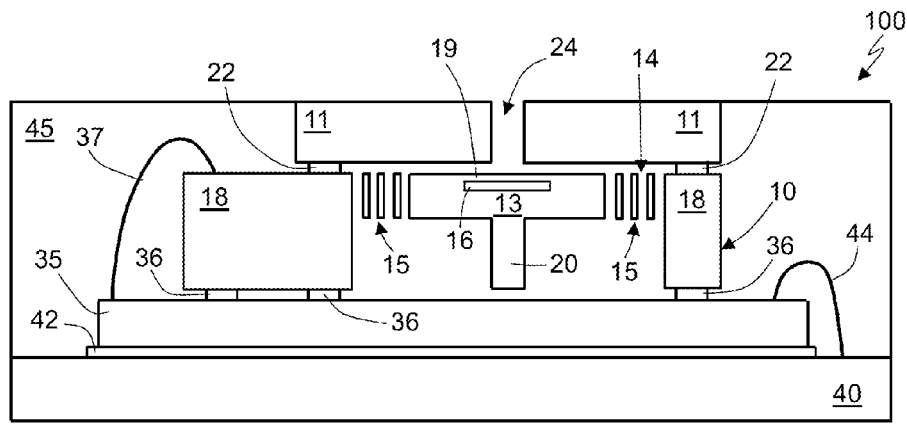
FIGS. 3-5 are cross-sections of different embodiments of the present MEMS device.

FIG. 3 shows a MEMS device 100 obtained using the MEMS sensor 1 of FIG. 1. Here, the back side of the die 10 (second face 10b) is bonded to a second die 35, for example an ASIC. For clarity, then, hereinafter the die 10 will be referred to as "first die 10" and the die 35 will be referred to as "second die 35".

In particular, here the spacers between the second die 35 and the second face 10b of the first die 10 are formed by a first adhesive layer 36, of patternable material, such as a biadhesive film, for example a DAF.

Furthermore, in the example shown, the first die 10 is electrically connected to the second die 35 via wire connection 37, in a per se known manner.

In turn, the second die 35 is fixed to a support 40 through an adhesive layer 42, for example a DAF. The support 40 is formed, for example, by a printed-circuit board, or other organic multilayer substrate, such as, for example, a BT (bismaleimide triazine) layer, for instance of the LGA (Land-Grid Array) type.

The second die 35 is electrically connected to the support 40 by means of wire connections 44, in a per se known manner.

Packaging material 45, for example plastic material, such as resin, laterally coats the cap 11, embeds the first and second dice 10, 35, and extends flush with the support 40 so as to encapsulate the first die 10 and completely insulate it from the external environment, except for the hole 24. With this solution, the MEMS device 100 has a minimal thickness. For instance, in samples manufactured by the present applicant, it has been possible to obtain MEMS devices 100 having an overall thickness of less than 650 μm.

Figure 4:
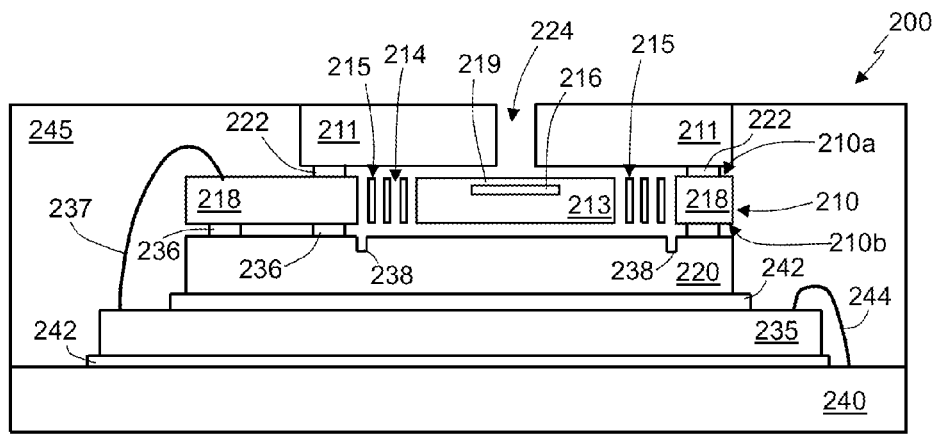

In the MEMS device 200 of FIG. 4, the closing region 12 of FIG. 1 is formed by a second cap 220 fixed to the second face of the first die.

In practice, the MEMS device 200 comprises a first die 210 similar to the first die 10 of FIGS. 1 and 3, and thus includes a suspended region 213 supported by a peripheral portion 218 through springs 215. Here, the first die 210 has a uniform thickness, with first and second faces 210a, 210b that delimit both the peripheral portion 218 and the suspended region 213 and define parallel planes. Also here, the suspended region 213 houses a buried cavity 216 delimiting a diaphragm 219 at the bottom.

The first cap 211 is also here fixed to the first face 210a of the die 200, for example through first bonding regions 222 (similar to the bonding regions 22 of FIG. 3), and has a hole 224 exposing the diaphragm 219 to the external environment.

The second cap 220 is similar to the first cap 211 and is thus formed by a body of semiconductor material, such as silicon, bonded to the second face 210b of the die 200 through second bonding regions 236. Containment trenches 238 in the second cap 220 surround the area of the die 200 where the sensitive part 213 and the springs 214 are formed so as to contain any possible spreading of the material of the second bonding regions 236.

In turn, the second cap 220 is fixed to a second die 235 forming a processing circuit and similar to the second die 35 of FIG. 3. The second die 235 is fixed to a support 240 (similar to the support 40 of FIG. 3) through an adhesive layer 242, for example a DAF.

A packaging material 245 laterally coats the first cap 211, embeds the first die 210, the second cap 220, and the second die 235, and extends laterally flush with the support 240 in a way similar to the package 45 of FIG. 3.

With this solution, due to the second cap 211, a much higher robustness of the MEMS sensor and of the corresponding MEMS device 200 is obtained at the expense of only a slight increase in the overall dimensions. In fact, the absence of the stem 20 of FIGS. 1, 3 compensates in part for the presence of a further layer (second cap 220) so that it is still possible to obtain MEMS devices 200 having an overall thickness of less than approximately 650 μm.

Figure 5:
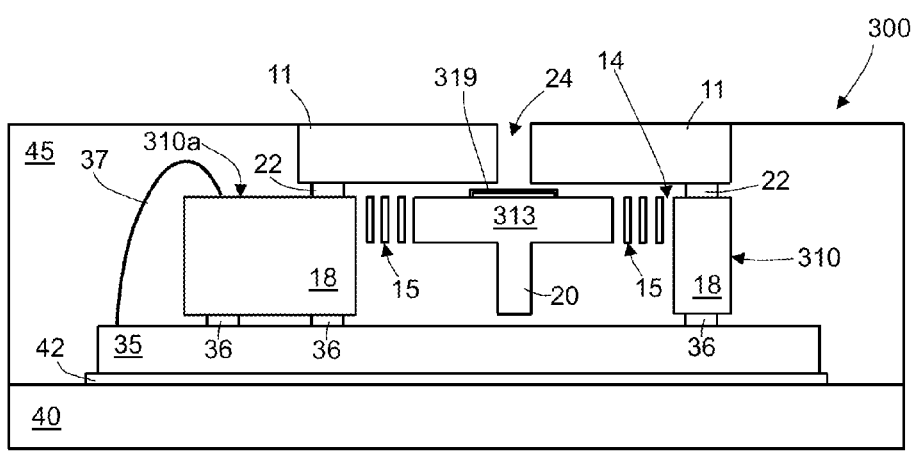

FIG. 5 shows an embodiment of a MEMS device 300 similar to the MEMS device 100 of FIG. 3, where the diaphragm (here designated by 319) extends over the first face 310a of the die 310 and is thus not formed within the suspended region 313. For the rest, the MEMS device 300 is altogether similar to the MEMS device 100 of FIG. 3 so that the components are designated by the same reference numbers. Alternatively, the MEMS device 300 could have the general structure of FIG. 4.

The MEMS sensor 1 of FIG. 1 is manufactured as described hereinafter with reference to FIGS. 6-12.

Figure 6:
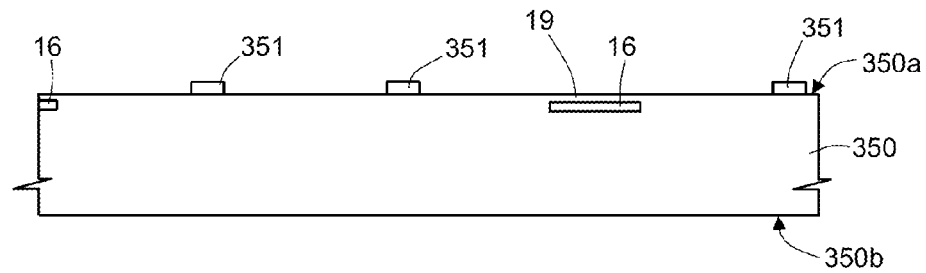
FIGS. 6-12 show cross-sections in successive manufacturing steps of the MEMS sensor of FIG. 1.

With reference to FIG. 6, a first wafer 350 of monocrystalline silicon, possibly covered with a passivation layer not shown and having a first face 350a and a second face 350b intended to form the first and second faces 10a, 10b of the first die 10 is processed so as to form the buried cavities 16 delimiting the diaphragms 19 at the bottom. The buried cavities 16 may be obtained in various ways, as taught, for example, in EP1577656. Also integrated in the first wafer 350 are components useful in the operation of the MEMS sensor, such as temperature sensors, heaters, piezoresistors, etc. Furthermore, a gold layer is deposited on the first face 350a of the first wafer 350 so as to form first bonding structures 351 (for example, ring-shaped).

Figure 7:
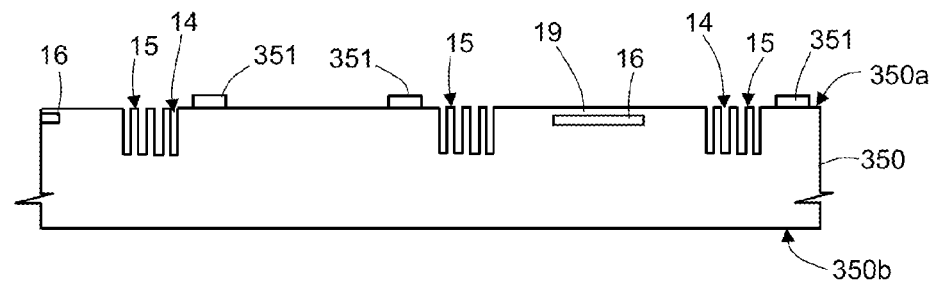
Figure 8:
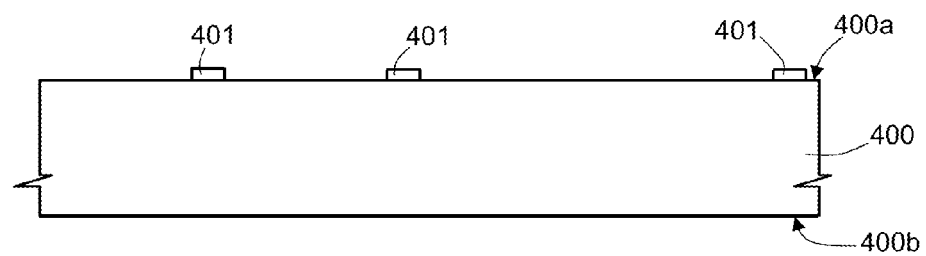
Figure 9:
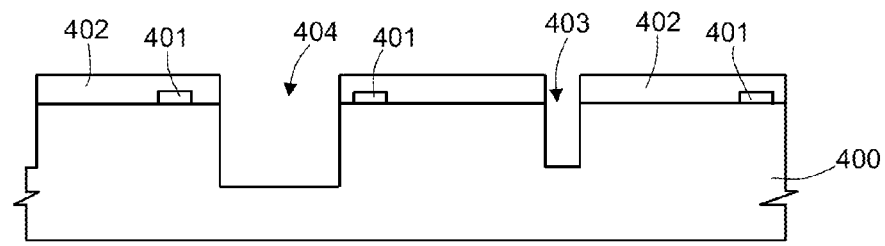

With reference to FIG. 7, the first wafer 350 is etched from the front by a silicon etching step so as to laterally define the trenches 14 and the springs 15.

In parallel, either before or after (FIG. 8), a second wafer 400 of monocrystalline silicon, possibly covered with a passivation layer (not shown) and having a first face 400a and a second face 400b, is provided with second bonding structures 401 (for example, ring-shaped). The second bonding structures 401 are formed on the first face 400a and may be manufactured in a similar way by depositing and patterning a gold layer, glass frit, or polymeric materials and have a shape and dimensions congruent with those of the first bonding structures 351.

The first face 400a of the second wafer 400 is covered with a patterning layer 402, typically a resist layer (FIG. 9), and deep silicon etch is carried out to obtain holes 403 and trenches 404. In particular, both the holes 403 and the trenches 404 have, for example, a circular or quadrangular shape. For instance, the holes 403 may have a diameter or width of the order of 10-100 μm, whereas the trenches 404 have a larger width, typically of some hundreds of microns, having the purpose of enabling the wire connections, as explained in greater detail hereinafter.

The etch is prolonged until both the holes 403 and the trenches 404 have a greater depth than the desired thickness for the cap 11 (FIG. 3), for instance, 190-240 μm (in general, holes 403 and trenches 404 have different depths owing to the different aspect ratios).

Figure 10:
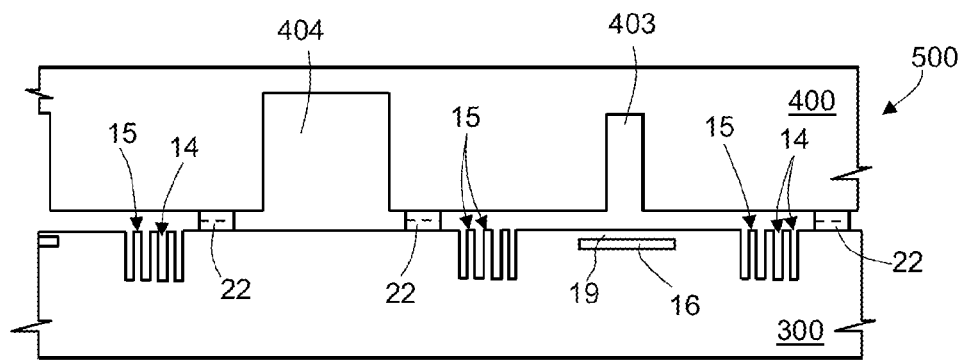

After removing the patterning layer 402 from the second wafer 400, the latter is flipped over and fixed to the first wafer 350 via a process of wafer-to-wafer bonding of a known type. In particular, the second wafer 400 is arranged so that its first face 400a looks toward the first face 350a of the first wafer 350 and the first bonding structures 351 are aligned to and in contact with the second bonding structures 401 and form with these the bonding regions 22. A composite wafer 500 is thus obtained (FIG. 10).

Figure 11:
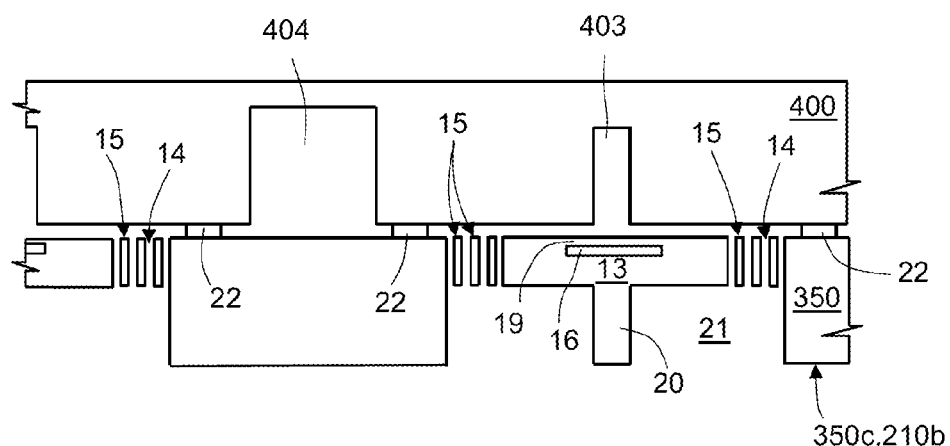

With reference to FIG. 11, the first wafer 350 is thinned from the second face 350b of the first wafer 350 (up to a thickness of, for example, 195 μm) in a purely mechanical way (mechanical polishing) and is then etched from the back to release the suspended regions 13 and the springs 15. In particular, a masked deep silicon etch is performed so as to remove the material of the first wafer 350 underneath the springs 15 and of part of the suspended region 13, whereas the parts intended to form the peripheral regions 18 and the stems 20 are protected. The air gaps 21 are thus formed.

Figure 12:
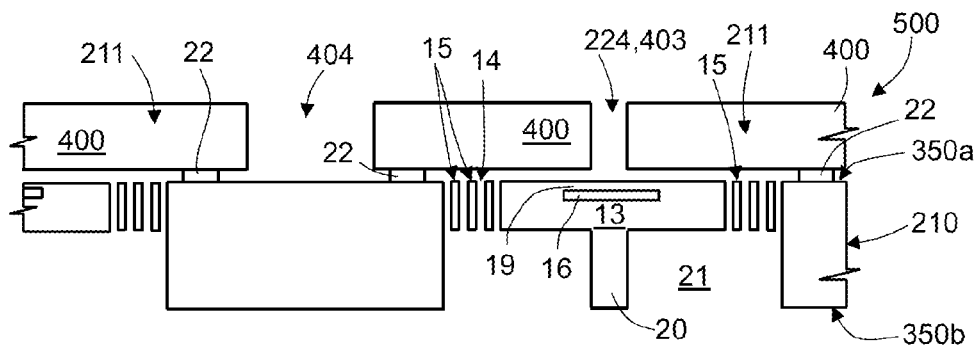

With reference to FIG. 12, the second wafer 400 is thinned until the bottom of the holes 403 and of the trenches 404 is reached (for example, to a thickness of approximately 210 μm of the second wafer 400), such as through a grinding step.

After fixing the closing region 12 to the die, for example, as indicated above, to a second wafer of semiconductor material, and cutting the composite wafer 500 of FIG. 12, the MEMS sensor 1 of FIG. 1 is obtained. Alternatively, if the closing region is not formed by a semiconductor material die, the composite wafer 500 of FIG. 12 is initially diced and then fixed to a support forming the closing region 12.

Alternatively, to form the MEMS device of FIG. 3, the composite wafer 500 of FIG. 12 is diced so as to separate the dice 10 and the corresponding caps 11. Using normal semiconductor manufacturing techniques, the second die 35 is obtained. The second die 35 is fixed to the second face 10b of the die 10 and is bonded to the support 40. The wire connections 37 and 44 (FIG. 3) are formed, and the package 45 is molded to obtain the MEMS device 100.

For manufacturing the MEMS device 300 of FIG. 4, it is possible to carry out steps like the ones described above in FIGS. 6-10, up to bonding the first and second wafers 350, 400.

Figure 13:
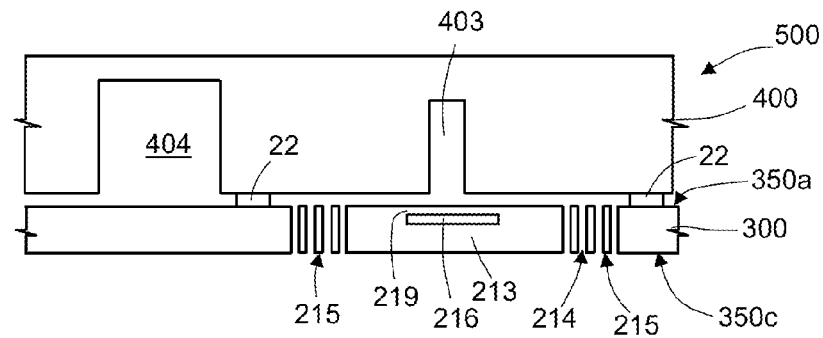
FIGS. 13-16 show cross-sections in successive manufacturing steps of the MEMS device of FIG. 4.

Consequently, after forming the trenches 214 in the first wafer 210, forming holes 403 and trenches 404 in the second wafer 400, and bonding the two wafers 350, 400 to obtain the composite wafer 500, the first wafer 350 is thinned, by grinding. Thereby (FIG. 13), the bottom portion of the first wafer 350 is removed from its second face 350b. In this embodiment, thinning proceeds until the first wafer 350 has a uniform thickness of, for example, 140 μm, and in any case until the trench 214 is reached. After thinning, the first wafer 350 is delimited between the first face 350a and a third face 350c.

Figure 14:
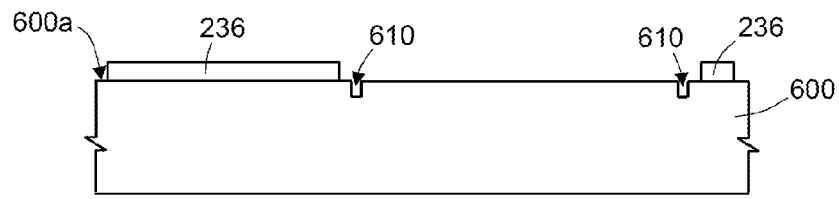

Simultaneously or previously, a third wafer 600 is processed to produce the second caps 220. In detail (FIG. 14), the third wafer 600 is initially etched to form the containment trenches 238 starting from a face 600a thereof, and the adhesive regions 236 are formed on the same face 600a.

Figure 15:
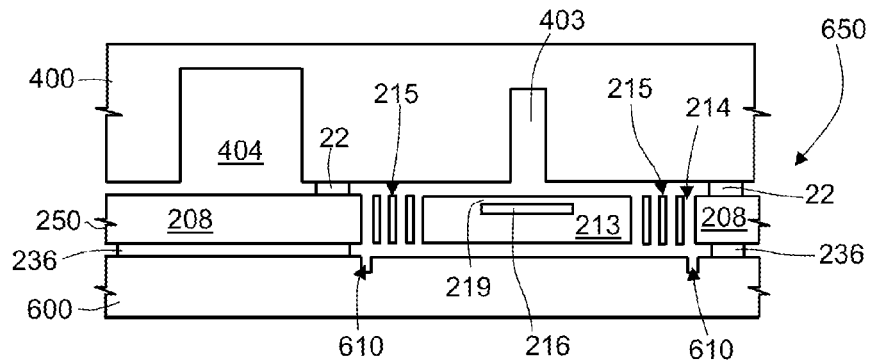

With reference to FIG. 15, the third wafer 600 is flipped over and fixed to the third face 350c of the first wafer 350 using a wafer-to-wafer bonding technique to obtain a second composite wafer 650. Then, the third wafer 600 is thinned by grinding, up to a thickness of, for instance, 170 μm.

Figure 16:
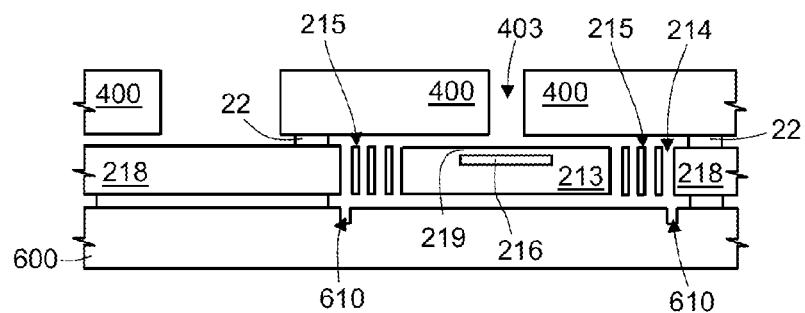

With reference to FIG. 16, and in a way similar to FIG. 12, the second wafer 400 is thinned from the back until the bottom of the holes 403 and of the trenches 404 is reached (for example, to a thickness of approximately 210 μm of the second wafer 400), through a grinding step.

The final steps described above then follow, including dicing the second composite wafer 650; forming the second die 235; fixing the second die to the second cap 220; bonding the support 240; forming the wire connections 237 and 244 (FIG. 4); and molding the package 245, to obtain the MEMS device 200.

Figure 17:
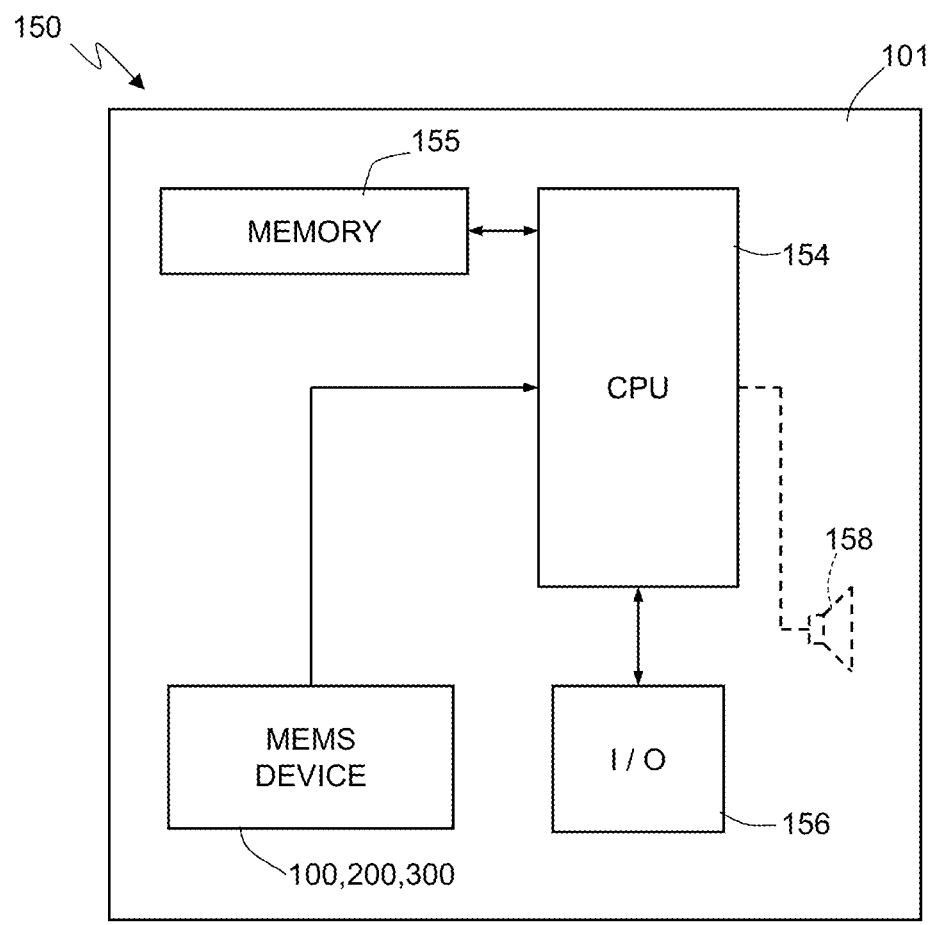
FIG. 17 shows an apparatus using the present MEMS device.

FIG. 17 is a schematic illustration of an electronic apparatus 150, which uses the MEMS device 100-300.

The electronic apparatus 150 comprises, in addition to the MEMS device 100-300, a microprocessor 154, a memory block 155 connected to the microprocessor 154, and an input/output interface 156, which is also connected to the microprocessor 154. Furthermore, a speaker 158 may be present, for generating a sound on one audio output (not shown) of the electronic apparatus 150.

In particular, the electronic apparatus 150 is fixed to the support 101, here formed by a printed circuit, to which are mechanically and electrically coupled the MEMS device 100-300 and, in addition, the microprocessor 154 and the memory block 155.

The electronic apparatus 150 is, for example, an apparatus for measuring blood pressure (sphygmomanometer), a household apparatus, a mobile communication device (cellphone, PDA, notebook) or an apparatus for measuring pressure that can be used in the automotive field.

The MEMS device 100-300 is thus able to: i) uncouple the sensitive portion (suspended region 13; 213; 313) from the rest 18; 218 of the die 10; 210; 310 housing the sensor, due to the presence of the springs 15, 215; ii) enable mechanical movement of the suspension springs and of the suspended region 13, 213, 313 as well as the fluidic connection of the diaphragm 19; 219; 319 to the external environment; iii) limit the mechanical stresses on the springs since the oscillations in a vertical direction of the sensitive portion are limited by the cap dice and by the stop structure (Z stopper).

In fact, separation between the peripheral portion 18, 218 and the suspended region 13, 213, 313 (and thus the diaphragm 19, 219 319) of the die 11, 210, 310 due to the trench 14, 214 prevents that any assembly stresses causes deformation of the diaphragm and variations of the electrical parameters of the sensor, which would generate imprecision in reading.

On the other hand, the suspended region 13, 213, 313 is protected from impact, stresses, and in general forces acting in a vertical direction thereon (perpendicular to the first face 10a, 210a of the first die), since the stop structure prevents any excessive vertical displacements, preserving the springs 15, 215 from destructive stresses.

In particular, the manufacturing procedures are based upon known steps that are common in MEMS processes. Furthermore, assembly schemes are not necessary that make use of pre-patterned caps (typically used for pressure sensors, gas sensors, humidity sensors, microphones, etc.), but it is possible to use standard resin packaging techniques so that the manufacturing costs are lower than those of similar sensors that are already commercially available. Moreover, the proposed process flow enables devices of small thickness to be obtained, for example, in applications on portable devices.

When the stop structure is obtained from direct interaction of the suspended region with the bottom body, in particular a second cap as shown in FIG. 4, there is the advantage that the MEMS sensor (not yet fixed to the processing circuit and to the support) is particularly robust. This may be particularly useful in the case of sensors not assembled in the manufacturing plant, but marketed and shipped for their assembly to even very remote places, since in this case they are protected by the second cap, which is more robust than a DAF or FOW layer. The presence of the bottom supporting cap moreover renders processing easier during testing, dicing, and assembly, since the possibility of errors is reduced in automatic robots for handling pieces and the possibility of failure of the piece is reduced. In addition, due to thinning-out of the first die, even though a further layer (second cap 220) is introduced, the overall vertical dimensions may be contained.

Finally, it is clear that modifications and variations may be made to the MEMS sensor and to the manufacturing process described and illustrated herein without thereby departing from the scope of the present disclosure.

For instance, the present MEMS sensor, instead of being a pressure sensor, could be a humidity sensor, a flow sensor, an environmental sensor (or else a combined pressure/humidity/temperature sensor), an air/gas sensor, a microfluidic device, or a miniaturized microphone.

The connection between the diaphragm and the external environment may be obtained via a fluidic path different from the hole 24, 224 in the first cap 11, 211, for example from beneath through a hole extending at least into the second die 35 and/or envisaging gaps between the layers underlying the first die 10, 210 and/or through the packaging material 45.

The cap 11, 211 may have a cavity forming a chamber overlying the diaphragm 19, 219, 319 when an additional space is desired. Furthermore, the first cap 11, 211 may be shaped so as to surround the first die 10, 210, 310 on three sides and be directly fixed to the integrated circuit 35, 235, to the second cap 220, and/or to the support 40, 240, in particular in the embodiments of FIGS. 3 and 5.

The connections 37, 237, 44, 244 between the first die 10, 210, 310 and the processing circuit 35, 235 and between this and the support 40, 240 may not be of the wire type; for example, they might use through vias and/or connections from the back.

Finally, the MEMS sensors of FIGS. 3 and 5 may also have a second cap similar to the second cap 211 of FIG. 4.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device comprising:
a first die of semiconductor material having a first face and a second face, the first die having:
   a suspended region;
   a trench;
   a peripheral region that is separated from the suspended region by the trench;
   elastic elements located in the trench and elastically coupling the suspended region to the peripheral region;
   a diaphragm formed in the first die or coupled to the suspended region and facing the first face; and
   a stop structure on the second face;
a first cap coupled to the first die, facing the first face of the first die and overlying the first die at least over the suspended region and the trench;
a fluidic path that fluidly couples the diaphragm to an environment external to the device; and
a closing body fixed to the second face of the first die and facing the stop structure, the closing body and the stop structure configured to limit movement of the suspended region above a threshold value in a direction perpendicular to the first face.

2. The MEMS device according to claim 1, wherein the suspended region, the peripheral region, and the elastic elements of the first die are monolithic.

3. The MEMS device according to claim 1, wherein the closing body is at least one of a second die of semiconductor material, a rigid body, and a printed-circuit board.

4. The MEMS device according to claim 1, wherein:
the peripheral region has a first thickness and the suspended region has a second thickness smaller than the first thickness,
an air gap extends underneath the suspended region, and
the stop structure further comprises a stem extending from the suspended region into the air gap, the stem having an first area in a plane parallel to the first face of the first body and being spaced apart from the closing body, the suspended region having a second area that is greater than the first area of the stem.

5. The MEMS device according to claim 3, wherein the stem is monolithic with the suspended region.

6. The MEMS device according to claim 1, wherein the peripheral region has first thickness and the suspended region has a second thickness, the first and second thicknesses being substantially the same, the MEMS device further comprising a spacer layer arranged between the peripheral region and the closing body that delimits a space between the first die and the closing body.

7. The MEMS device according to claim 1, comprising a through hole that extends through the first cap.

8. The MEMS device according to claim 1, comprising a packaging material laterally enclosing portions of the first die and the first cap.

9. The MEMS device according to claim 8, wherein a support is fixed to the closing body, portions of the closing body being surrounded by the packaging material and including a processing circuit.

10. The MEMS device according to claim 1, forming at least one of a pressure sensor, a humidity sensor, a flow sensor, an environmental sensor, a gas sensor, a microfluidic device, and a miniaturized microphone.

11. An apparatus comprising:
a processing unit;
an input/output interface coupled to the processing unit;
a memory device coupled to the processing unit; and
a MEMS device including:
a semiconductor die having a first face and a second face, the semiconductor die having:
a suspended region;
a peripheral region;
elastic elements that elastically couple the suspended region to the peripheral region; and
a diaphragm formed in the semiconductor die or coupled to the suspended region and facing the first face;
a first cap coupled to the semiconductor die and forming a cavity between the first face of the semiconductor die and the first cap, the cavity located above the diaphragm, the first cap including an opening that places the cavity in fluid communication with an environment external to the MEMS device;
a closing body fixed to the second face of the semiconductor die; and
a stop structure configured to limit movement of the suspended region above a threshold value in a direction perpendicular to the first face, the stop structure located on the second face of the semiconductor die.

12. The apparatus according to claim 11, wherein the suspended region, the peripheral region, and the elastic elements are monolithic.

13. The apparatus according to claim 11, wherein the peripheral region has a first thickness between the first face to the second face, and the suspended region has a second thickness between the first face to the second face, the second thickness being less than the first thickness.

14. A process for manufacturing a MEMS device, the process comprising:
forming, in a semiconductor die having a first face and a second face, a suspended region and a peripheral region separated by a trench, a stop structure on the second face, wherein the suspended region is elastically coupled to the peripheral region by elastic elements located within the trench, the suspended region supporting a diaphragm facing the first face, and a fluidic path fluidly coupling the diaphragm to an environment external to the device;
fixing a first cap to the semiconductor die so that the first cap faces the first face of the semiconductor die;
fixing a closing body to the second face of the semiconductor die and facing the stop structure, the closing body and the stop structure configured to limit movement of the suspended region above a threshold value in a direction perpendicular to the first face.

15. The process according to claim 14, wherein removing selective portions of the semiconductor die comprises releasing the suspended region and the elastic elements.

16. The process according to claim 14, wherein fixing a first cap comprises forming a composite wafer by fixing a first wafer to a plurality of semiconductor dice on a second wafer, the process further comprising thinning the first wafer, and dicing the composite wafer to obtain a plurality of MEMS sensors.

17. The process according to claim 16, comprising removing selective portions of the second wafer from the first face to define suspended regions and elastic elements prior to fixing the second wafer to the first wafer and forming the stem in the second face of the second wafer prior to dicing the composite wafer.

18. The process according to claim 16, wherein forming the stop structure comprises forming a cavity from the second face of the second wafer under the diaphragm, the cavity being in fluid communication with the trench and laterally surrounding the stem extending from the suspended region.

19. The process according to claim 16, further comprising thinning the second wafer from the second face of the second wafer prior to forming the stem.

20. The process according to claim 16, wherein fixing a closing region comprises fixing a third wafer to the second wafer prior to dicing the composite wafer.

21. The process according to claim 14, comprising:
fixing the closing body to a support; and
forming a package material that encloses, together with the support, the second die, the closing region, the first die, and the cap.

* * * * *